United States Patent
Liu et al.

(10) Patent No.: US 8,609,526 B2
(45) Date of Patent: Dec. 17, 2013

(54) PREVENTING UBM OXIDATION IN BUMP FORMATION PROCESSES

(75) Inventors: Chung-Shi Liu, Shin-Chu (TW); Cheng-Chung Lin, Taipei (TW); Ming-Che Ho, Tainan (TW); Kuo Cheng Lin, Hsin-Chu (TW); Meng-Wei Chou, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 377 days.

(21) Appl. No.: 12/842,617

(22) Filed: Jul. 23, 2010

(65) Prior Publication Data

US 2011/0092064 A1  Apr. 21, 2011

Related U.S. Application Data

(60) Provisional application No. 61/253,425, filed on Oct. 20, 2009.

(51) Int. Cl.
*H01L 21/445* (2006.01)
*H01L 21/4757* (2006.01)

(52) U.S. Cl.
USPC .... 438/614; 438/677; 438/687; 257/E21.023; 257/E21.602

(58) Field of Classification Search
None
See application file for complete search history.

(56) References Cited

U.S. PATENT DOCUMENTS

| | | | |
|---|---|---|---|
| 4,357,203 A * | 11/1982 | Zelez | 438/623 |
| 4,920,639 A * | 5/1990 | Yee | 29/846 |
| 6,204,192 B1 * | 3/2001 | Zhao et al. | 438/723 |
| 6,218,281 B1 | 4/2001 | Watanabe et al. | |
| 6,229,220 B1 | 5/2001 | Saitoh et al. | |
| 6,319,842 B1 * | 11/2001 | Khosla et al. | 438/714 |
| 6,578,754 B1 | 6/2003 | Tung | |
| 6,592,019 B2 | 7/2003 | Tung | |
| 6,593,656 B2 * | 7/2003 | Ahn et al. | 257/762 |
| 6,782,897 B2 * | 8/2004 | Wang et al. | 134/1.2 |
| 6,818,545 B2 | 11/2004 | Lee et al. | |
| 6,853,076 B2 | 2/2005 | Datta et al. | |

(Continued)

FOREIGN PATENT DOCUMENTS

| | | |
|---|---|---|
| CN | 1330395 A | 1/2002 |
| CN | 101359597 A | 2/2009 |
| JP | 05-335313 | 12/1993 |
| JP | 2000-228420 | 8/2000 |

OTHER PUBLICATIONS

Dietrich, L.; Toepper, M.; Ehrmann, O.; Reichl, H.; , "Conformance of ECD wafer bumping to future demands on CSP, 3D integration, and MEMS," Electronic Components and Technology Conference, 2006. Proceedings. 56th, pp. 1050-1058.*

(Continued)

*Primary Examiner* — Thomas L Dickey
*Assistant Examiner* — Joseph Schoenholtz
(74) *Attorney, Agent, or Firm* — Slater & Matsil, L.L.P.

(57) ABSTRACT

A method of forming an integrated circuit structure includes forming a copper-containing seed layer on a wafer, and performing a descum step on an exposed surface of the copper-containing seed layer. The descum step is performed using a process gas including fluorine and oxygen. A reduction/purge step is then performed on the exposed surface of the copper-containing seed layer using a nitrogen-containing gas. A copper-containing layer is plated on the copper-containing seed layer.

20 Claims, 8 Drawing Sheets

(56) References Cited

U.S. PATENT DOCUMENTS

| | | | |
|---|---|---|---|
| 6,917,119 B2 | 7/2005 | Lee et al. | |
| 7,064,436 B2 | 6/2006 | Ishiguri et al. | |
| 7,271,030 B2 * | 9/2007 | Bojkov et al. | 438/107 |
| 7,319,071 B2 * | 1/2008 | Hineman et al. | 438/687 |
| 7,391,112 B2 | 6/2008 | Li et al. | |
| 7,807,579 B2 * | 10/2010 | Yang et al. | 438/706 |
| 2001/0049181 A1 * | 12/2001 | Rathi et al. | 438/471 |
| 2002/0074242 A1 * | 6/2002 | Morrissey et al. | 205/704 |
| 2002/0119677 A1 * | 8/2002 | Soda et al. | 438/780 |

OTHER PUBLICATIONS

Tokunaga, K.; Koiwa, A.; Suzuki, N.; Takeda, K.; Makabe, K.; Nishihara, S.; Koike, A.; , "FOUP mini-environment contamination control optimizing nitrogen purging," 2003 IEEE International Symposium on Semiconductor Manufacturing, pp. 463-466, Sep. 30-Oct. 2, 2003.*

Cyclotene Advanced Electronic Resins, Processing Procedures for BCB Adhesion, Dow Chemical Jun. 2007.*

Gilkes, Daniele. Copper Seed Aging Effects on Post Electroplating Defects. Diss. University of Florida, 2002.*

Kim, G. S., and C. Steinbrüchel. "Plasma Etching of Benzocyclobutene in CF4/O2 and SF6/O2 Plasmas." Journal of Vacuum Science & Technology A: Vacuum, Surfaces, and Films 24.3 (2006): 424.*

Gigafab Microwave Plasma Systems Series, Download from URL < http://www.pvateplaamerica.com/90.php> on Sep. 1, 2012.*

Jittinorasett, Suwanna. UBM Formation on Single Die/Dice for Flip Chip Applications. Diss. Virginia Polytechnic Institute and State University, 1999. Blacksburg, Virginia: 1999.*

Elke Zakel, "WLCSP and Flichip Production using electroelss Ni/Au plating and Wafer Level Solder Sphere Transfer Technologies" Microtech, 2010 (Cambridge, UK), Mar. 2010.*

Scott Szymanski, "WLP Photoresist Descuming with Plasma Treatment", Advanced Packaging Industry News, Feb. 2007.*

Oberhammer, G., F. Niklaus, and G. Stemme. "Selectrive Wafer-Level Adhesive Bonding with Benzocyclobutene for Fabriaction of Cavities." Sensors and Actuators A 105 (2003): 297-304.*

Khairallah Y, et. al. Decomposition of gaseous dielectrics (CF4, SF6) by a non-equilibrium plasma. Mechanisms, kinetics, mass spectrometric studies and interactions with polymeric targets, Pure and Appl. Chem., vol. 66, No. 6 pp. 1353-1362 (1994).*

Jiaxiang Nie; Yun Kang; Ruipeng Yang; Na Su; Weiye He; Sheng Liu; Xiangtao Kong; , "Investigation and reduction of metal voids post-CMP in dual damascene process," Solid-State and Integrated-Circuit Technology, 2008. ICSICT 2008. 9th International Conference on , vol., No., pp. 1223-1226, Oct. 20-23, 2008.*

F. Chen "Plasma-Induced Oxide Damage, A status Report", Department of Electrical Engineering, UCLA 1996.*

Rioux, K., et. al. rf and microwave plasma for resist and post etch polymer removal, Solid State Technology, Dec. 2001.*

Conformance of ECD wafer bumping to future demands on CSP, 3D integration, and MEMS, Electronic Components and Technology Conference, 2006. Proceedings. 56th, pp. 1050-1058.*

Zakel, E.,"WLCSP Production using electroless NiAu Plating and Wafer Level Solder Spere transfer Technology", International Wafer-Lever Packaging Conference, (San Jose, California), Oct. 15-16, 2008.*

Savas, S., Inductively Coupled Plasma for Hightly Efficient and Low Damage Resist Stripping, 1st International Symposium on Plasma Process Induced Damage, May 13-14, 1996 Santa Clara CA.*

Baklanov, M.R., et. al. Characterization of Cu surface cleaning by hydrogen plasma, J. Vac. Sci. Technol. B 19, 1201 (2001) pp. 1201-1211.*

Topper, M., Wafer Level Chip Scale Packaging—Materials for Advanced Packaging edited by Lu, Daniel, and C. P. Wong, New York: Springer, 2008.*

Cyclotene Advanced Electronic Resins , Processing Procedures for BCB Adhesion, Dow Chemical Jun. 2007.*

Tokunaga, K., Koiwa, A., Suzuki, N., Takeda, K., Makabe, K., Nishihara, S., Koike, A, "FOUP mini-environment contamination control optimizing nitrogen purging," 2003 IEEE International Symposium on Semiconductor Manufacturing, pp. 463-466, Sep. 30-Oct. 2, 2003.*

Plasma-Induced Oxide Damage, A status Report, Department of Electrical Engineering, UCLA 1996.*

Tomohisa, S. et al., "Prevention of Cu Degradation Usin in situ $N_2$ Plasma Treatment in a Dual-Damascene Process," J. Vac. Sci. Technol. B, vol. 23, No. 5, Sep./Oct. 2005, pp. 2084-2088.

Kurihara, K., "Enhancement of Copper Surface Oxidation in an Air Atmosphere Due to Fluorine Residue," Japanese Journal of Applied Physics, vol. 43, No. 10A, 2004, pp. L 1284-L 1286.

* cited by examiner

PREVENTING UBM OXIDATION IN BUMP FORMATION PROCESSES

This application claims the benefit of U.S. Provisional Application No. 61/253,425 filed on Oct. 20, 2009, entitled "Preventing UBM Oxidation in Bump Formation Processes," which application is hereby incorporated herein by reference.

TECHNICAL FIELD

This disclosure relates generally to integrated circuits and more particularly to bump formation processes.

BACKGROUND

In the formation of a semiconductor chip, integrated circuit devices, such as transistors are first formed at the surface of a semiconductor substrate in the chip. Interconnect structures are then formed over the integrated circuit devices. Bumps are formed on the surface of the chip, so that the integrated circuit devices can be accessed.

In a typical bump formation process, an under-bump metallurgy (UBM) is formed, followed by the formation of a bump on the UBM. The UBM formation may include forming a copper seed layer and forming and patterning a mask on the copper seed layer so that a portion of the copper seed layer is exposed through an opening in the mask. A plating step is then performed to plate a thick copper layer on the exposed portion of the copper seed layer.

In the forming and patterning of the mask, residues (known as scum) of the mask may be undesirably left or be generated as a by-product of the patterning step. A descum step is then performed to remove the scum before the copper plating. It was observed that the queue time (Q-time) after the descum step was often very short, sometime shorter than 12 hours, wherein the Q-time is the time that the respective wafer can be stored without incurring significant degradation before the copper plating is performed. However, many process steps may be needed before the copper plating is performed, and these process steps may take a long period of time. If the Q-time expires before the copper plating has been performed, the respective wafer has to be re-descumed to re-clean the surface of the wafer. However, the re-descum would cause a change in the shape and dimension of the mask, and hence a change in the shape and dimension of the resulting plated copper.

Another problem found in the conventional bump formation process is the bump-lost problem. During the subsequent bonding process, bumps may peel off due to an unreliable adhesion between the copper seed layer and the plated copper. The above-discussed challenges contribute significantly to the high manufacturing costs and poor bump reliability.

SUMMARY

In accordance with one aspect of the embodiment, a method of forming an integrated circuit structure includes forming a copper-containing seed layer on a wafer, and performing a descum step on an exposed surface of the copper-containing seed layer. The descum step is performed using a process gas, including fluorine and oxygen. A reduction/purge step is then performed on the exposed surface of the copper-containing seed layer using a nitrogen-containing gas. A copper-containing layer is plated on the copper-containing seed layer.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments and do not limit the scope of the disclosure.

A novel integrated circuit formation process is provided in accordance with an embodiment. The intermediate stages of manufacturing an embodiment are illustrated. The variations of the embodiment are discussed. Throughout the various views and illustrative embodiments, like reference numbers are used to designate like elements.

Figure 1:
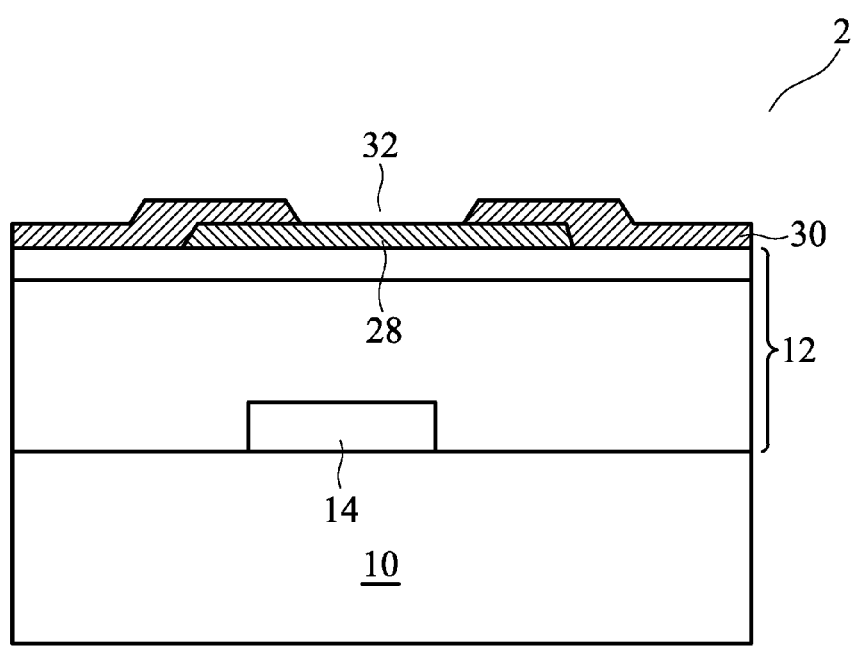
FIGS. 1 through 6B are cross-sectional views of intermediate stages in the manufacturing of under bump metallurgies (UBM) in accordance with the embodiments.

Referring to FIG. 1, wafer 2, which includes substrate 10, is provided. Substrate 10 may be a semiconductor substrate, such as a bulk silicon substrate, although it may include other semiconductor materials, such as group III, group IV, and/or group V elements. Semiconductor devices 14, such as transistors, may be formed at the surface of substrate 10. Interconnect structure 12, which includes metal lines and vias (not shown) formed therein and connected to semiconductor devices 14, is formed over substrate 10. The metal lines and vias may be formed of copper or copper alloys, and may be formed using the well-known damascene processes. Interconnect structure 12 may include commonly known inter-layer dielectrics (ILDs) and inter-metal dielectrics (IMDs).

Metal pad 28 is formed over interconnect structure 12. Metal pad 28 may comprise aluminum, and hence may also be referred to as aluminum pad 28, although it may also be formed of, or include, other materials, such as copper, silver, gold, nickel, tungsten, alloys thereof, and/or multi-layers thereof. Metal pad 28 may be electrically connected to semiconductor devices 14, for example, through underlying interconnection structure 12. In an embodiment, passivation layer 30 is formed to cover edge portions of metal pad 28. In an embodiment, passivation layer 30 is formed of polyimide or other known dielectric materials. Opening 32 is formed in passivation layer 30, with metal pad 28 exposed through opening 32. Additional passivation layers may be formed over interconnect structure 12 and at the same level, or over, metal pad 28. The additional passivation layers may be formed of materials such as silicon oxide, silicon nitride, un-doped silicate glass (USG), polyimide, and/or multi-layers thereof.

Figure 2:
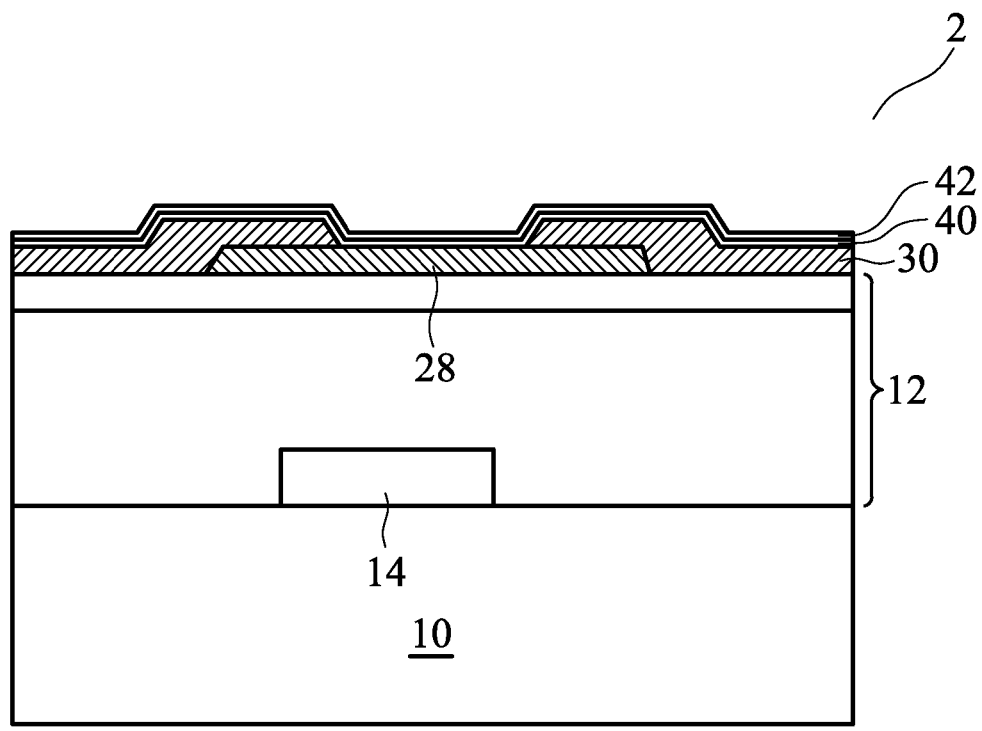

Referring to FIG. 2, diffusion barrier layer 40 and thin seed layer 42 are blanket formed. Diffusion barrier layer 40 may be a titanium layer, a titanium nitride layer, a tantalum layer, or a tantalum nitride layer. The materials of seed layer 42 may include copper or copper alloys, and hence is referred to as copper seed layer 42 hereinafter. However, other metals, such as silver, gold, aluminum, and combinations thereof, may also be included. In an embodiment, diffusion barrier layer 40 and copper seed layer 42 are formed using sputtering. Diffusion barrier layer 40 may have a thickness equal to about 1 kÅ and copper seed layer 42 may have a thickness equal to about 5 kÅ, although their thicknesses may also be greater or smaller. One skilled in the art will realize that the dimensions recited throughout the description are merely examples and will be scaled with the down-scaling of integrated circuits.

Figure 3:
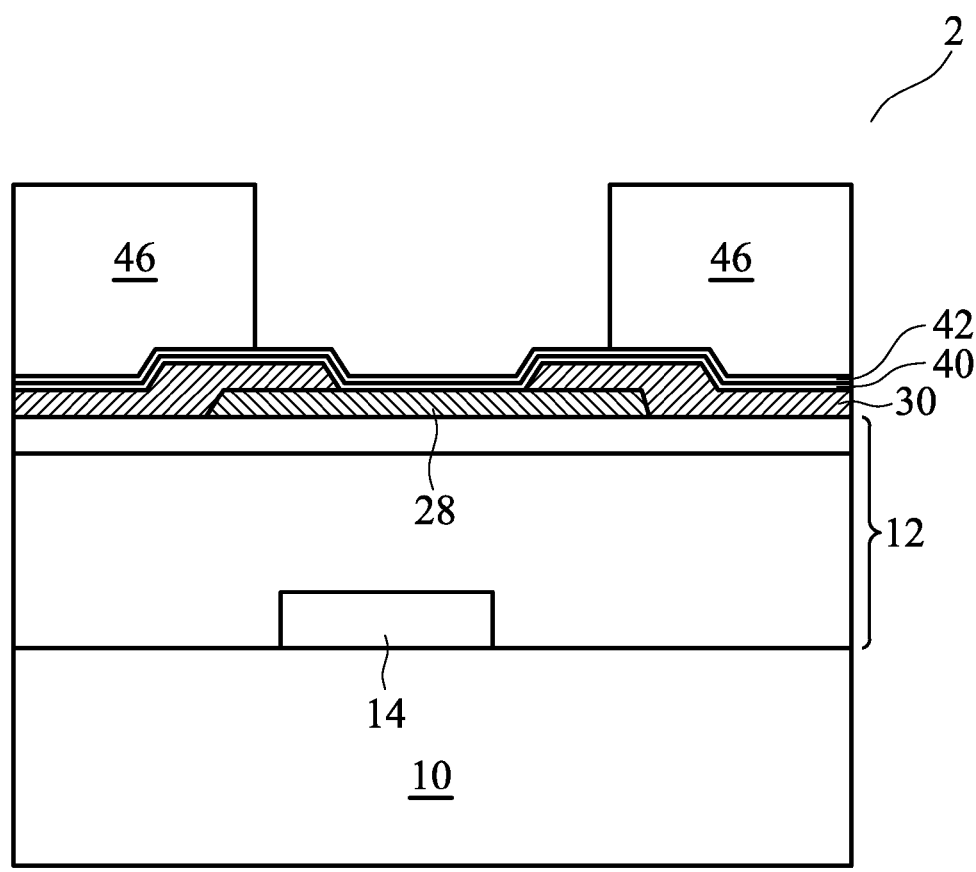

FIG. 3 illustrates the formation of mask 46. In an embodiment, mask 46 is a dry film and may be formed of an organic material, such as Ajinimoto buildup film (ABF). In alternative embodiments, mask 46 is formed of a photo resist. The thickness of mask 46 may be greater than about 5 μm, or even between about 10 μm and about 120 μm.

Figure 7:
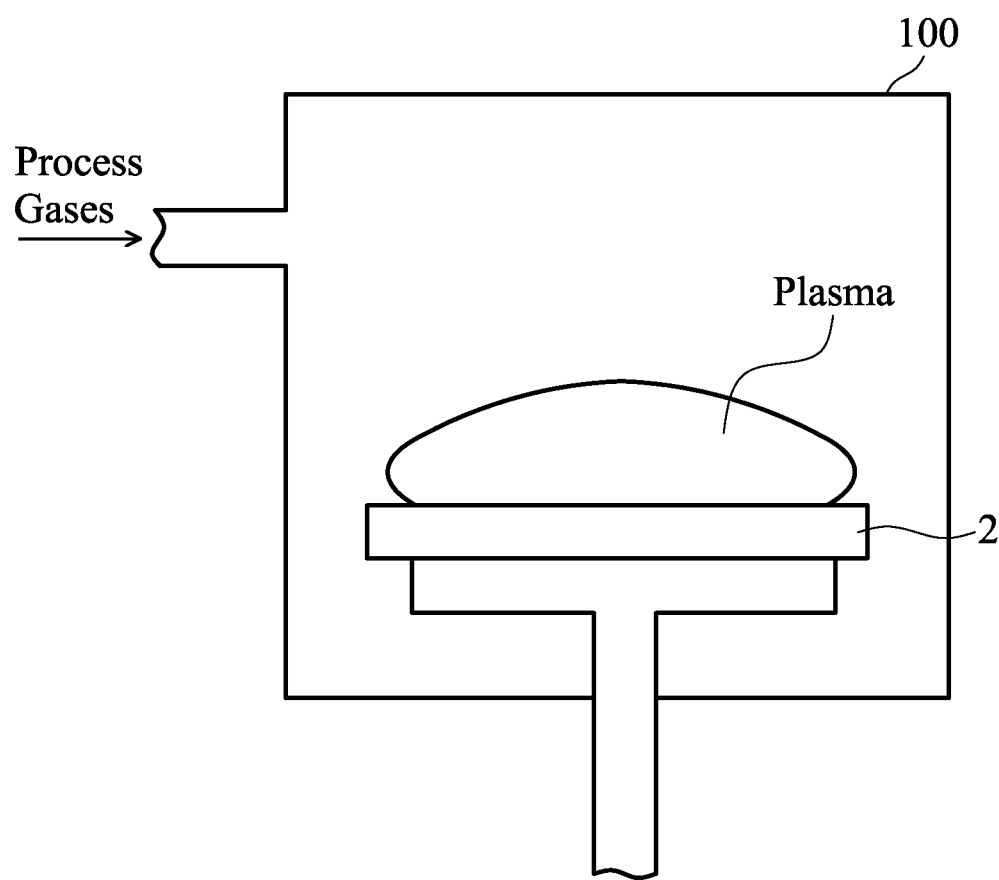
FIG. 7 illustrates a cross-sectional view of a wafer in a process chamber, wherein a reduction/purge step is performed to the wafer.

Mask 46 is then patterned, for example, by etching, so that copper seed layer 42 is exposed. Residues (not shown), which may be the remaining portion of mask 46 and/or the by-product generated in the patterning of mask 46, may be left over copper seed layer 42. In an embodiment, as schematically illustrated in FIG. 7, a first descum step is performed in process chamber 100 to remove the residues from wafer 2. The process gases of the first descum step may include tetrafluoride ($CF_4$), nitrogen ($N_2$), and oxygen ($O_2$) (referred to as $CF_4/N_2/O_2$ hereinafter). After the flow of $CF_4/N_2/O_2$ is stable, a plasma is generated from the process gases, for example, by applying either a microwave and/or a radio frequency (RF) bias. The plasma has the effect of removing the residues. After the first descum step, the $CF_4/N_2/O_2$ gases are pumped out.

It is realized that the first descum step may adversely cause the oxidation of copper seed layer 42, resulting in copper oxide to be generated on the surface of copper seed layer 42. Experiment results have revealed that at the surface of copper seed layer 42, the oxygen atomic percentage may be as high as about 21 percent, indicating the existence of copper oxide. A first reduction and/or purge (referred to as reduction/purge) step is thus performed to the structure as shown in FIG. 3 to eliminate/reduce the adverse effect.

In an embodiment, the reduction/purge gases used in the first reduction/purge step comprise hydrogen ($H_2$) and a non-active gas, which may be $N_2$ and/or an inert gas, such as argon (Ar). $H_2$ is used for the reduction of copper, while the non-reactive gas may be used for purging wafer 2. After the flow of the reduction/purge gases is stable, a microwave may be applied to the reduction/purge gases to generate a plasma. However, no RF bias is applied so that there is no bombardment effect to copper seed layer 42. In an exemplary embodiment, the energy of the microwave may be between about 0.1 KW and about 1_KW, and the reduction/purge step may last between about 5 seconds and about 1 minute. In alternative embodiments, the reduction/purge gases may comprise $N_2$ and $O_2$. In which case, no plasma of $N_2$ and $O_2$ is generated so that $O_2$ will not cause the oxidation of copper seed layer 42. The introduction of $O_2$ helps recover the bonds of mask 46 from the damage caused by the first descum step. In yet other embodiments, $N_2$, or an inert gas, such as Ar, is used to purge wafer 2, and no $H_2$ and/or $O_2$ are added.

The first descum step and the first reduction/purge step are optional, and in alternative embodiments, they may not be performed. A baking process is then performed on wafer 2 to harden mask 46. The baking process may be performed in an oven at a temperature equal to about 130° C., for example, for about one hour.

After the baking process, a second descum step is performed, followed by a second reduction/purge step. The second descum step may be essentially the same as the first descum step. The second reduction/purge step may also be essentially the same as the first reduction/purge descum step. The details of the second descum step and the second reduction/purge step are thus not repeated herein. It is realized that the second descum step may have the adverse effect of causing the oxidation of copper seed layer 42. In addition, fluorine (F) may be left on copper seed layer 42. Experiment results have revealed that at the surface of copper seed layer 42, the oxygen atomic percentage may be as high as about 20 percent, and the fluorine atomic percentage may be as high as about 3.5 percent, with the remaining percentage being the percentage of copper. Further, it was noticed that fluorine may penetrate into copper seed layer 42 to a depth greater than 430 Å, while oxygen may penetrate into copper seed layer 42 to a depth greater than 1000 Å. Fluorine may adversely accelerate the oxidation of copper seed layer 42. In addition, during the queue time (Q-time) of wafer 2, fluorine may diffuse out of copper seed layer 42 and contaminate other wafers stored in the same wafer storage, such as a front opening unified pod (FOUP) as wafer 2. It was observed that the second reduction/purge step substantially fully removes oxygen and fluorine from copper seed layer 42. Experiments have indicated that substantially no trace of oxygen and fluorine can be found in copper seed layer 42 after the second reduction/purge step.

During the Q-time of wafer 2, and before a subsequent plating step is performed, wafer 2 may be stored in a FOUP that is charged with $N_2$ gas, so that wafer 2 is isolated from detrimental substances, such as oxygen, moisture, and the like. Alternatively, the FOUP with wafer 2 therein may be purged with a continuous $N_2$ flow, so that fluorine, if any, diffused out of wafer 2 may be purged.

Figure 4:
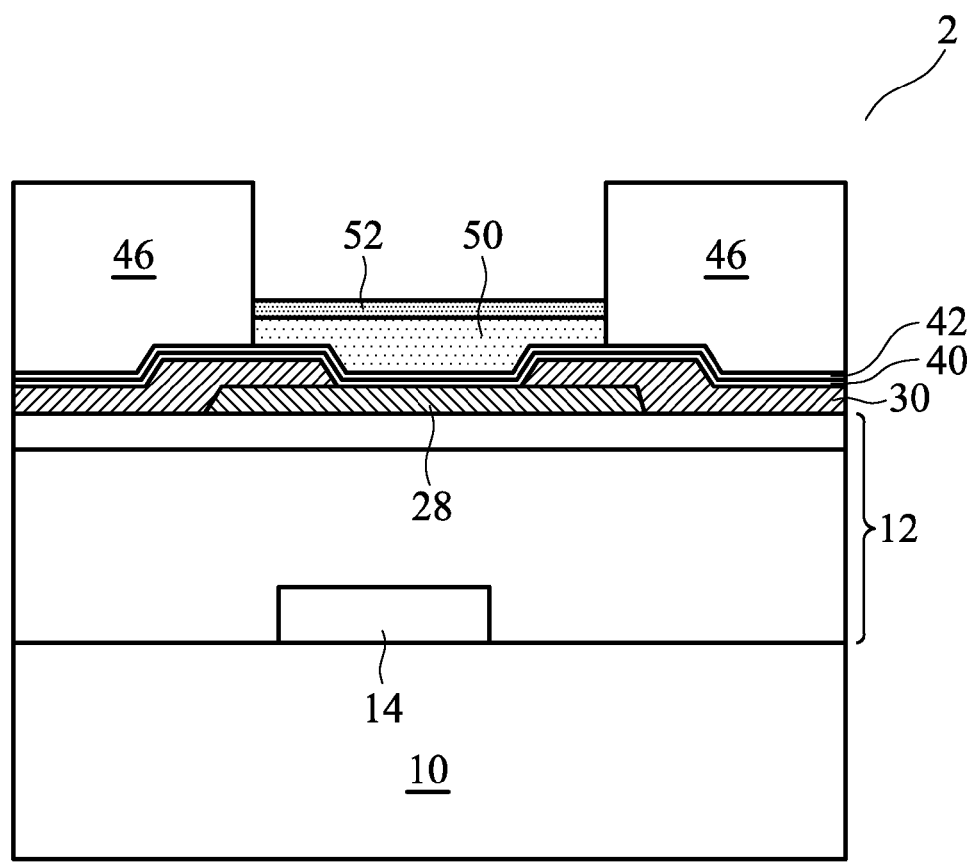

Referring to FIG. 4, copper is plated on the exposed surface of copper seed layer 42 in mask 46 to form copper layer 50. In an exemplary embodiment, the thickness of copper layer 50 is about 3 μm to about 7 μm. In other embodiments, the thickness of the copper layer 50 is about 40 μm to about 60 μm so that copper layer 50 becomes a copper post. Metal layer 52 may be optionally formed on the copper layer 50. In an embodiment, metal layer 52 is a nickel-containing layer comprising, for example, a nickel layer or a nickel alloy layer by plating. Next, solder layer 60 is formed on nickel layer 52, for example, by plating. Solder layer 60 may be a lead-free pre-solder layer formed of, for example, SnAg, or a solder material, including alloys of tin, lead, silver, copper, nickel, bismuth, or combinations thereof.

Figure 5:
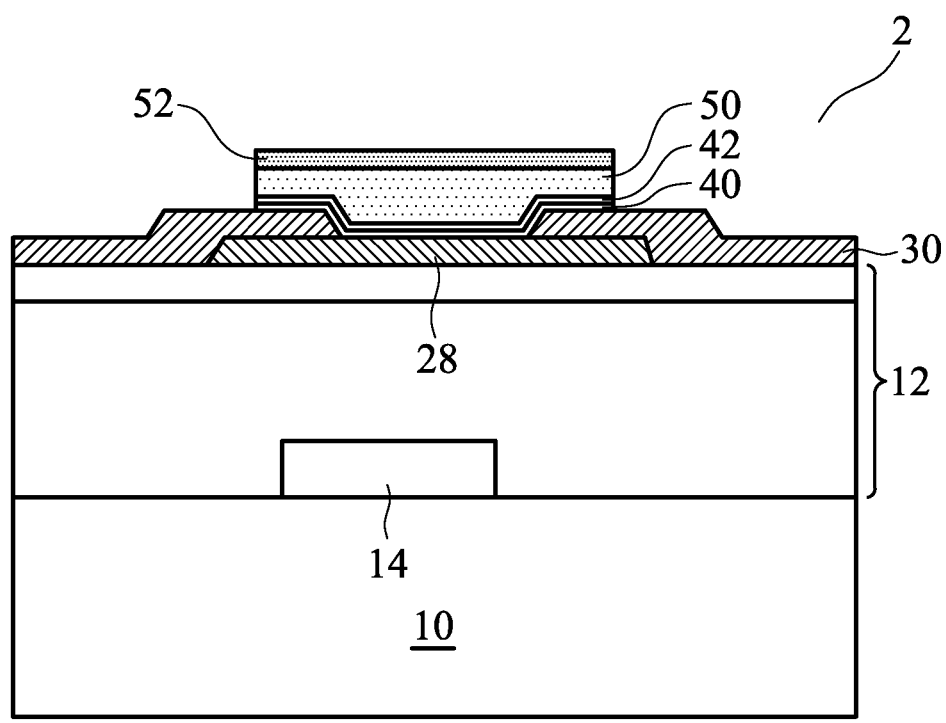
Figure 6A:
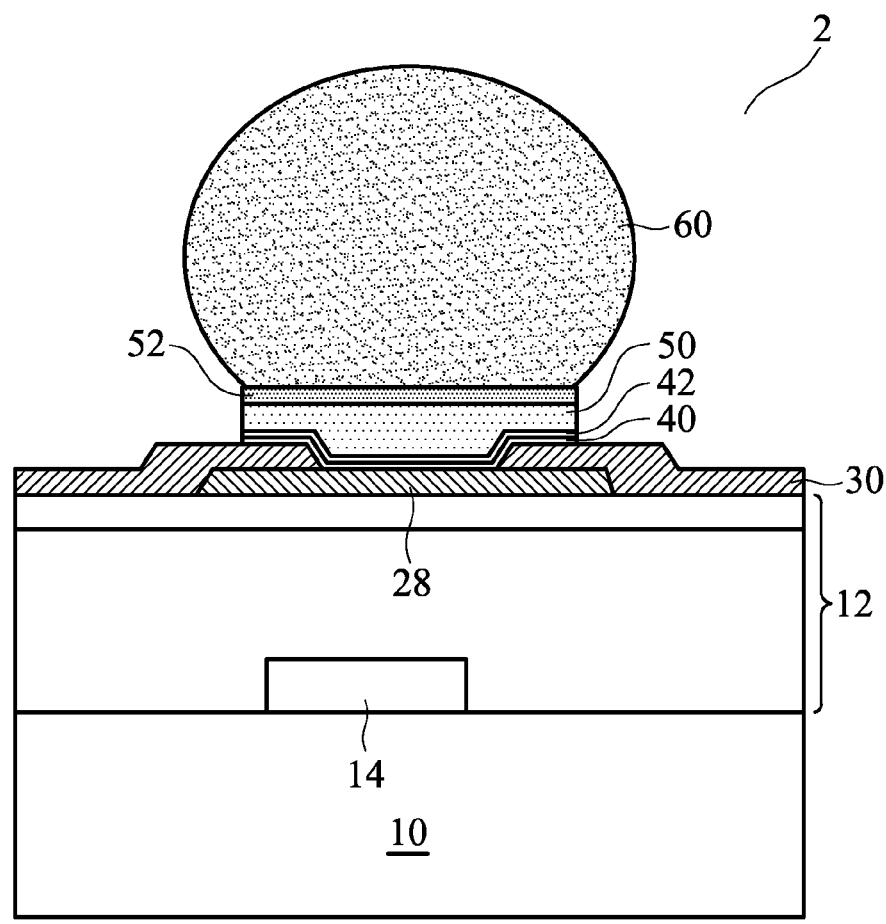

In FIG. 5, mask 46 is removed. As a result, the portions of copper seed layer 42 underlying mask 46 are exposed. The exposed portions of copper seed layer 42 are then removed by a flash etching. Next, the exposed portions of diffusion barrier layer 40 are removed. A solder reflowing process is then performed to form solder layer 60 as a solder bump 60a, as shown in FIG. 6A.

Figure 6B:
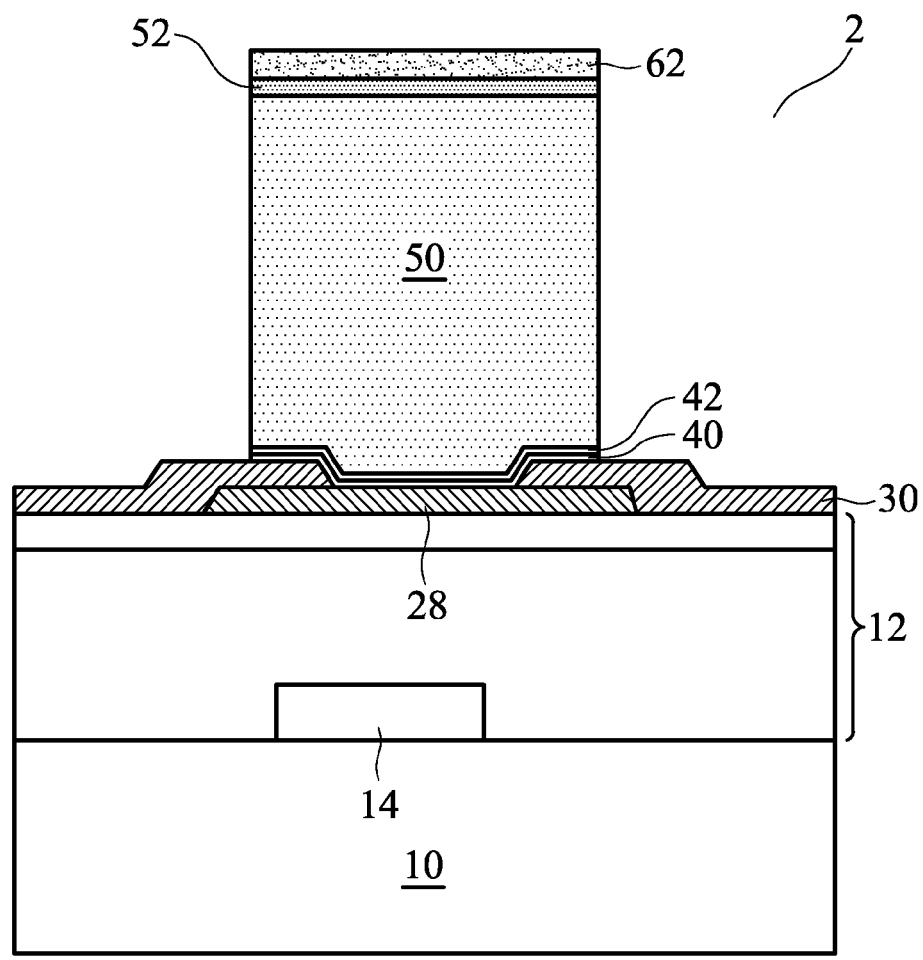

In alternative embodiments, as shown in FIG. 6B, the thickness of copper layer 50 is increased so that copper layer 50 becomes a copper post. The process for forming copper post 50 is essentially the same as shown in FIGS. 2 through 4. In this embodiment, after the optional formation of metal layer 52 on copper post 50 and before the removal of mask 46, solder layer 62, which may be a thin solder layer, may be plated on metal layer 52.

The results of the embodiments are shown in Table 1, wherein the resistivity values of copper seed layer 42 in various sample wafers are listed to show the effect of the embodiments.

TABLE 1

|  | Pre-Rs (mOhm/Sq) | Post-Rs (mOhm/Sq) |
|---|---|---|
| Sample wafer 1 | 38.66 | 38.68 (12-Hr Q-time) |
|  |  | 38.62 (48-Hr Q-time) |
| Sample wafer 2 | 38.98 | 45.5 (12-Hr Q-time) |
| Sample wafer 3 | 38.63 | 38.99 (12-Hr Q-time) |
|  |  | 39.02 (48-Hr Q-time) |

The column denoted as "Pre-Rs" shows the resistivities of copper seed layers 42 measured immediately after they are formed, while the column denoted as "Post-Rs" shows the resistivities of copper seed layers 42 after a certain Q-time. In sample wafer 1, no descum step was performed. It was observed that after a 12-hour Q-time and after a 48-hour Q-time, the resistivity of copper seed layer 42 in sample wafer 1 does not change, indicating that no oxidation occurs to copper seed layer 42. In sample wafer 2, descum steps without reduction/purge steps were performed. Before the descum step, the resistivity of copper seed layer 42 in sample wafer 2 was 38.98 mOhm/Sq. After the descum step and a 12-hour Q-time, the resistivity of copper seed layer 42 in sample wafer 2 increases significantly to 45.5 mOhm/Sq. The comparison between the results of sample wafers 1 and 2 indicates that the descum step has a significant adverse effect on the quality of copper seed layer 42.

In sample wafer 3, descum steps and reduction/purge steps were performed. Before the descum step, the resistivity of copper seed layer 42 in sample wafer 3 was 38.63 mOhm/Sq. After the descum step and a 12-hour Q-time, the resistivity of copper seed layer 42 in sample wafer 3 increases only slightly to 38.99 mOhm/Sq. After an additional 36-hour Q-time, the resistivity increases slightly to 39.02 mOhm/Sq, which is substantially the same as the resistivity after the 12-hour Q-time. Comparing the results of sample wafer 2 and sample wafer 3, it is found that the reduction/purge step significantly improves the UMB formation process, and has the effect of recovering copper seed layer 42 from the damage caused by the descum steps.

Further experiment results have revealed that if descum steps are performed but no reduction/purge step is performed, an obvious interface between copper seed layer 42 and copper layer 50 is visible. However, if a reduction/purge step is performed after the descum steps, no interface is visible. In addition, as the results in Table 1 indicate, the Q-time of the seed layer of the embodiments may be as long as 48 hours with no obvious oxidation occurring to the seed layer, while in wafers formed using conventional descum steps with no reduction/purge step performed, the Q-time may be less than about 12 hours. Accordingly, the embodiments significantly improve the process window in the formation of UBMs.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming an integrated circuit structure, the method comprising:
    forming a copper-containing seed layer on a wafer;
    performing a descum step on an exposed surface of the copper-containing seed layer, wherein the descum step is performed using a process gas comprising fluorine and oxygen;
    performing a reduction/purge step on the exposed surface of the copper-containing seed layer using a nitrogen-containing gas, the nitrogen-containing gas of the reduction/purge step comprising oxygen ($O_2$) and $N_2$; and
    plating a copper-containing layer on the copper-containing seed layer.

2. The method of claim 1 further comprising:
    forming a nickel-containing layer over the copper-containing layer; and
    forming a solder layer on the nickel-containing layer.

3. The method of claim 1 further comprising:
    forming a mask over the copper-containing seed layer;
    patterning the mask to expose the exposed surface of the copper-containing seed layer; and
    baking the mask.

4. The method of claim 3, wherein the descum step and the reduction/purge step are performed before the step of baking the mask.

5. The method of claim 3, wherein the descum step and the reduction/purge step are performed after the step of baking the mask and before the step of plating the copper-containing layer.

6. The method of claim 1, wherein during the reduction/purge step, no plasma is generated.

7. The method of claim 1 further comprising:
    after the reduction/purge step and before the step of plating the copper-containing layer, storing the wafer in a wafer storage; and
    purging the wafer storage with a continuous $N_2$ gas flow.

8. A method of forming an integrated circuit structure, the method comprising:
    forming a copper-containing seed layer on a wafer;
    forming a mask over the copper-containing seed layer;
    patterning the mask to expose a surface portion of the copper-containing seed layer;
    baking the mask;
    after the step of baking the mask, performing a descum step on the surface portion of the copper-containing seed layer, wherein the descum step is performed using a process gas comprising fluorine and oxygen, the descum step forming a copper oxide layer in the copper-containing seed layer;
    removing the copper oxide layer by performing a reduction step on the surface portion of the copper-containing seed layer using a nitrogen-containing gas, wherein there is no bombardment effect to the copper-containing seed layer during the reduction step, and wherein no plasma is generated during the reduction step; and
    after the reduction step, plating a copper-containing layer on the copper-containing seed layer.

9. The method of claim 8 further comprising:
    before the step of baking the mask, performing an additional descum step on the surface portion of the copper-containing seed layer, wherein the descum step is formed using an additional process gas comprising fluorine and oxygen; and before the step of baking the mask and after the step of performing the additional descum step, performing an additional reduction step on the surface portion of the copper-containing seed layer using an additional nitrogen-containing gas.

10. The method of claim 8, wherein the process gas used in the descum step comprises $CF_4$, oxygen ($O_2$), and nitrogen ($N_2$).

11. The method of claim 8 further comprising forming a solder layer over and electrically connected to the copper-containing layer.

12. The method of claim 8, wherein the nitrogen-containing gas used in the reduction step comprises $O_2$ and $N_2$.

13. The method of claim 8 further comprising:
after the reduction step and before the step of plating the copper-containing layer, storing the wafer in a wafer storage; and
purging the wafer storage with a continuous $N_2$ gas flow.

14. The method of claim 8, wherein the reduction step is performed after the descum step.

15. The method of claim 3 further comprising:
before the step of baking the mask, performing an additional descum step on the exposed surface of the copper-containing seed layer, wherein the descum step is formed using an additional process gas comprising fluorine and oxygen; and
before the step of baking the mask and after the step of performing the additional descum step, performing an additional reduction/purge step on the exposed surface of the copper-containing seed layer using an additional nitrogen-containing gas.

16. The method of claim 3 further comprising:
removing the mask to expose a second exposed surface of the copper-containing seed layer; and
removing the second exposed surface of the copper-containing seed layer.

17. The method of claim 1, wherein plating the copper-containing layer forms a copper post.

18. The method of claim 8 further comprising forming a nickel-containing layer over the copper-containing layer.

19. The method of claim 8, wherein plating the copper-containing layer forms a copper post.

20. The method of claim 11 further comprising performing a reflow process on the solder layer to form a solder bump.

* * * * *